(12) United States Patent
Qiao et al.

(10) Patent No.: US 6,372,634 B1
(45) Date of Patent: Apr. 16, 2002

(54) PLASMA ETCH CHEMISTRY AND METHOD OF IMPROVING ETCH CONTROL

(75) Inventors: Jianmin Qiao, Fremont; Sanjay Thekdi, Santa Clara; Manuj Rathor; James E. Nulty, both of San Jose, all of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/333,459

(22) Filed: Jun. 15, 1999

(51) Int. Cl.$^7$ .......................................... H01L 21/3065
(52) U.S. Cl. .................... 438/637; 438/706; 438/710; 438/723
(58) Field of Search ............................... 438/637, 706, 438/710, 723

(56) References Cited

U.S. PATENT DOCUMENTS

| | | | |
|---|---|---|---|
| 4,211,601 A | 7/1980 | Mogab | 156/643.1 |
| 4,376,672 A | 3/1983 | Wang et al. | 156/643.1 |
| 4,412,885 A | 11/1983 | Wang et al. | 156/643.1 |
| 4,447,290 A | 5/1984 | Matthews | 156/626 |
| 4,581,101 A | 4/1986 | Senoue et al. | 438/706 |
| 4,666,555 A | 5/1987 | Tsang | 156/643.1 |
| 4,842,683 A | 6/1989 | Cheng et al. | 156/345 |
| 5,266,154 A | 11/1993 | Tatsumi | 216/67 |
| 5,268,200 A | 12/1993 | Steger | 427/249 |
| 5,338,399 A | 8/1994 | Yanagida | 216/67 |
| 5,354,386 A | 10/1994 | Cheung et al. | 148/33.1 |
| 5,376,228 A | 12/1994 | Yanagida | 438/714 |
| 5,376,234 A | 12/1994 | Yanagida | 438/695 |
| 5,441,596 A | 8/1995 | Nulty | 156/643.1 |
| 5,445,712 A | 8/1995 | Yanagida | 438/695 |
| 5,468,342 A | 11/1995 | Nulty et al. | 156/643.1 |
| 5,514,247 A | 5/1996 | Shan et al. | 156/643.1 |
| 5,562,801 A | 10/1996 | Nulty | 156/643.1 |
| 5,583,737 A | 12/1996 | Collins et al. | 361/234 |
| 5,811,357 A | 9/1998 | Armacost et al. | 438/723 |
| 5,814,563 A | 9/1998 | Ding et al. | 438/714 |
| 5,817,579 A | 10/1998 | Ko et al. | 438/740 |

(List continued on next page.)

FOREIGN PATENT DOCUMENTS

| | | | |
|---|---|---|---|
| EP | 0 078 161 A2 | 5/1983 | ......... H01L/21/306 |
| EP | 0 109 706 A1 | 5/1984 | ........... H01L/21/31 |
| EP | 0 691 678 A2 | 1/1996 | ......... H01L/21/311 |
| EP | 0 825 278 A1 | 2/1998 | ........... C23C/16/44 |

OTHER PUBLICATIONS

Vochchenkov, "Plasma etching: An enabling technology for gigahertz silicon integrated circuits," J. Vac. Sci. Technol. A, vol. 11, No. 4, Jul. 1993, pp. 1211–1220.

Primary Examiner—T. N. Quach
(74) Attorney, Agent, or Firm—Kevin L. Daffer; Conley, Rose & Tayon P.C.

(57) ABSTRACT

A plasma etch chemistry and etch methodology is provided to improve critical dimension control for openings formed into and/or through a semiconductor thin film. According to an embodiment, the plasma etch chemistry includes an etchant mixture comprising a first etchant of the formula $C_xH_yF_z$ (where $x \geq 2$, $y \geq 1$ and $z \geq 2$) and a second etchant other than the first etchant to form the openings. The relationship of x, y and z may be such that y+z equals an even number $\leq 2x+2$. According to an alternative embodiment, the plasma etch chemistry further includes strained cyclic (hydro)fluorocarbon. The plasma etch chemistry may be used to form openings in the layer in a single-etch step. In a further embodiment, the plasma etch chemistry described herein may etch less than the entire thickness of the layer, and a second plasma etch chemistry substantially free of the first etchant and strained cyclic (hydro)fluorocarbons etches the remainder of the layer to form the openings. Such an etch methodology advantageously reduces the risk of etching the materials underlying the layer.

29 Claims, 3 Drawing Sheets

U.S. PATENT DOCUMENTS

| | | |
|---|---|---|
| 5,824,375 A | 10/1998 | Gupta .................... 427/569 |
| 5,874,013 A | 2/1999 | Tokunaga et al. ............. 216/67 |
| 5,904,566 A | 5/1999 | Tao et al. ................... 438/689 |
| 5,928,967 A | 7/1999 | Radens et al. ............. 438/740 |
| 5,942,446 A | 8/1999 | Chen et al. ................. 438/734 |
| 5,948,701 A | 9/1999 | Chooi et al. ................ 438/694 |
| 5,962,347 A * | 10/1999 | Tokunage et al. ........... 438/728 |
| 5,976,766 A | 11/1999 | Kasuga et al. .............. 430/313 |
| 6,017,826 A | 1/2000 | Zhou et al. ................. 438/720 |
| 6,080,648 A | 6/2000 | Nagashima ................. 438/592 |
| 6,083,845 A * | 7/2000 | Yang et al. ................. 438/734 |
| 6,133,153 A * | 10/2000 | Marquez et al. ............ 439/706 |

* cited by examiner

PLASMA ETCH CHEMISTRY AND METHOD OF IMPROVING ETCH CONTROL

BACKGROUND OF THE INVENTION

1. Field of the Invention

This invention relates to integrated circuit manufacturing and, for example, to forming openings into or through a material that exists above a semiconductor substrate.

2. Description of the Related Art

In the fabrication of semiconductor devices, numerous conductive device regions and layers are formed in or on a semiconductor substrate. The conductive regions and layers of the device are isolated from one another by a dielectric, such as silicon dioxide ("oxide"). At several stages during fabrication, it is necessary to make openings in a material, such as a dielectric, to allow for contact to underlying regions or layers. Generally, an opening through a dielectric exposing a diffusion region within a semiconductor substrate or an opening through a dielectric layer between polycrystalline silicon ("polysilicon") and the first metal layer is called a "contact opening", while an opening in other dielectric layers, such as an opening through an interlevel dielectric layer ("ILD"), is referred to as a "via". As used herein, an "opening" will be understood to refer to any type of opening through any type of material, such as a dielectric layer, regardless of the stage of processing, layer exposed, or function of the opening.

To form the openings in the dielectric layer, a patterning layer of photoresist is formed over the dielectric layer. Openings are formed in the photoresist corresponding to the regions of the dielectric layer where the dielectric layer openings are to be formed. The openings in the photoresist may be formed using, for example, photolithography patterning and etch techniques that are well known to those of ordinary skill in the art.

In most modern processes of forming openings in the dielectric layer, a dry etch is performed subsequent to patterning the photoresist, wherein the dielectric layer is exposed to a plasma, formed in a flow of one or more gases. Typically, one or more halocarbons and/or one or more other halogenated compounds are used as the etchant gas. For example, $CF_4$, $CHF_3$, $C_2F_6$, $SF_6$, $NF_3$, and other gases may be used as the etchant gas. Additionally, gases such as $O_2$, Ar, $N_2$, or He, for example, may be added to the gas flow. The particular gas mixture used will depend on, for example, the characteristics of the dielectric being etched, the stage of processing, the etch tool being used, and the desired etch characteristics, such as etch rate, wall slope, and anisotropy, among others.

Many of the etch characteristics are generally believed to be affected by a passivation material that may occur with the etch process. The passivation material may contain carbon, possibly derived from carbon within the etchant and/or from carbon-based compounds within or upon the material being etched. The carbon-containing residue may be a polymer. The carbon-containing residue may form concurrently with the dry etch. For this reason, the fluorine-to-carbon ratio ("F/C ratio") in the plasma is considered an important determinant in the dry etch. For a more thorough discussion of dry etching, see S. Wolf and R. N. Tauber, *Silicon Processing for the VLSI ERA, Volume* 1, pp. 539–585 (Lattice Press, Sunset Beach, Calif.; 1986), incorporate herein by reference.

As the dimensions of integrated circuits have been reduced, problems with uniformity of lateral dimensions of the openings have increased. As used herein, "lateral dimension" refers to the dimension of an opening fabricated in a dielectric layer, typically as measured in a direction substantially parallel to an upper surface of a semiconductor substrate upon which the integrated circuit is formed. "Critical dimension" as used in this application refers to the design value of the opening in the dielectric and, by extension, to the lateral size of an opening in the patterned photoresist above the dielectric layer site where the dielectric opening is to be formed. Critical dimensions are of interest since they can represent the smallest lateral dimension that can be formed on a topography using various techniques such as photolithography. A lateral dimension can be represented by an opening formed within a film, a structure formed upon a film or substrate, and/or a spacing between structures.

In general, lateral dimensions require close control to prevent deviation from the critical dimensions and to ensure optimal device performance. "Dimensional uniformity" as used in this application refers to the correspondence between the design value of a critical dimension and the value of the corresponding lateral dimension obtained during fabrication. For example, a combination of $CF_4$ and/or $CHF_3$ may be used as etchant gases for performing a plasma etch through a patterned photoresist, and Ar, and $N_2$ may be used as a carrier/inert gas in the plasma etch chamber. Such a combination typically provides good dimensional uniformity for openings formed through a dielectric (i.e., good correspondence between the design values and the values obtained during fabrication).

Figure 1:
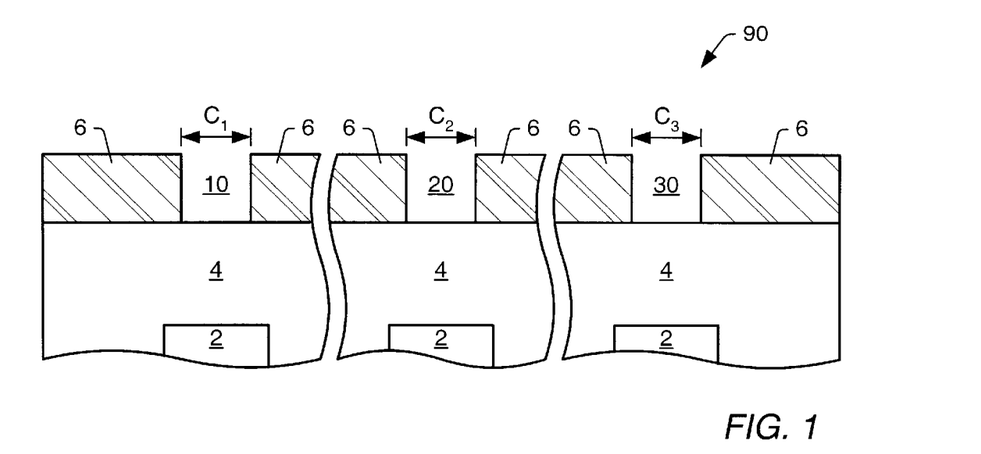
FIG. 1 depicts a semiconductor topography including a patterned photoresist layer.

FIG. 1 depicts a portion of a semiconductor topography 90 including a conductive line 2 with a dielectric layer 4 formed over the conductive line. According to an embodiment, conductive line 2 may include a metal. According to an alternative embodiment, conductive line 2 may include doped polysilicon. Conductive line 2 may be spaced above a semiconductor substrate on a wafer (not shown) by intervening layers of dielectric, semiconductive and/or conductive material. Alternatively, dielectric layer 4 may be formed directly upon portions of the semiconductor substrate. Patterned photoresist 6 resides upon dielectric layer 4.

Openings 10, 20, and 30 may be formed in photoresist layer 6 using well-known photolithography techniques. Openings 10, 20, and 30 are preferably formed with predetermined lateral dimensions $C_1$, $C_2$, and $C_3$, respectively. Opening 20 is shown to be near the center 3 of the wafer, while openings 10 and 30 are shown near the edges 1 of the wafer. According to an embodiment, the lateral dimensions may be substantially uniform and can be relatively small in size—comparable to a critical dimension. Alternatively, the lateral dimensions $C_1$, $C_2$, and $C_3$ may vary from each other.

Figure 2:
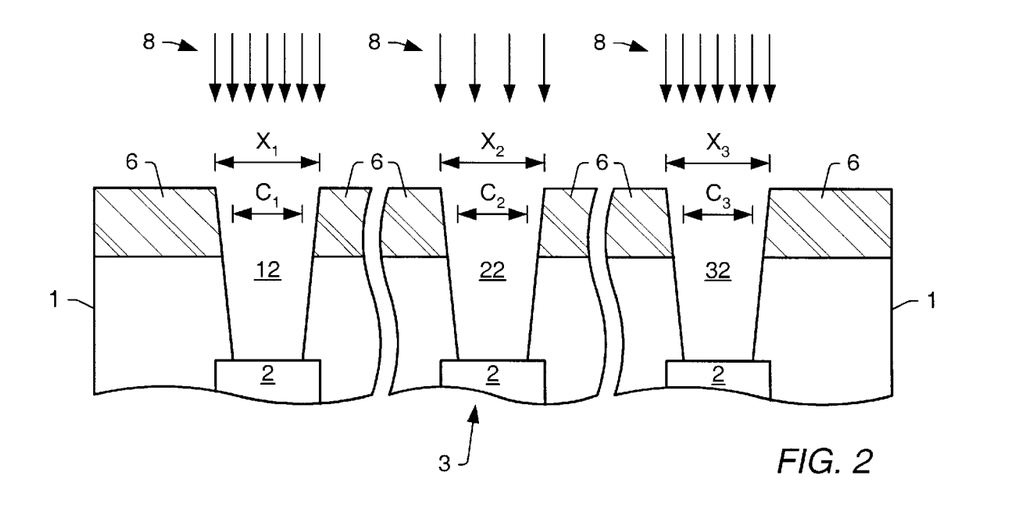
FIG. 2 depicts the semiconductor topography of FIG. 1 in which openings have been formed.

Turning to FIG. 2, openings 12, 22, and 32, which may be of predetermined lateral dimension or of critical dimension, have been formed in dielectric layer 4 by exposure of the dielectric layer to plasma etch 8. As shown in FIG. 2, lateral dimensions $x_1$, $x_2$, and $x_3$ of openings 12, 22, and 32, respectively, may vary. It is to be noted that features in FIGS. 1 and 2 are not drawn to scale, but are exaggerated in order to highlight, for example, potential differences between lateral dimensions $x_1$, $x_2$, and $x_3$ of openings 12, 22, and 32.

It is thought that photoresist erosion may cause the lateral dimensions of openings formed in the underlying dielectric layers to vary from the design values of the critical dimensions. Photoresist erosion generally occurs more rapidly near the edges 1 of a wafer than at the center 3. It is thought that this is due to higher temperatures at the wafer edges.

The higher temperatures might result from a higher concentration of plasma 8 being present proximate the wafer edges than proximate the wafer center, as shown by the density of the arrows depicting plasma 8 in FIG. 2. As the size of critical dimensions is reduced, the use of, for example, a $CF_4/CHF_3/Ar/N_2$ etchant gas mixture may result in openings with unacceptable dimensional uniformity. That is, the variation $\Delta C_i$ in the lateral dimension $x_i$ for the ith opening, where $\Delta C_i = x_i - C_i$ and $C_i$ is the critical dimension of the ith opening, may be considered unacceptable if $|\Delta C_i|$ exceeds a critical variation (e.g., a percentage of the value of $C_i$ specified by the operator).

It is therefore desirable that an alternative plasma etch chemistry and/or methodology be developed to improve critical dimension uniformity. Alternative etch chemistries and methodologies ideally should provide the desired etch characteristics without (i) requiring extensive redesign of the process or process tools, (ii) providing or causing unacceptable performance or process maintenance tradeoffs, or (iii) using costly and unproven equipment.

SUMMARY OF THE INVENTION

The problems outlined above are in large part solved by an embodiment of the present invention concerning a method for forming openings in a material across a wafer. Additionally, the openings themselves are dimensioned to be relatively uniform across the wafer. The method comprises etching the material with a combination of etchants. At least one of the etchants include a low C/F ratio additive of the formula $C_xH_yF_z$, (where $x \geq 2$, preferably $2 \leq x \leq 6$; where $y \geq 1$, preferably $1 \leq y \leq 2x$; where $z \geq 2$, preferably $2 \leq z \leq 2x+1$), such as 1,1,1,2-tetrafluoroethane ($CH_2F$—$CF_3$), or a combination of $CH_2F$—$CF_3$ and a cyclic (hydro)fluorocarbon. Such low C/F ratio additives may maintain the lateral dimension and/or area of openings across the wafer within a predetermined critical variation.

For purposes of this application, a (hydro)fluorocarbon is a compound that contains carbon and fluorine and that may optionally contain hydrogen. Many plasma etchers may produce higher temperatures at the edges of wafers than at the centers, possibly due to higher electric fields at the wafer edges or poor wafer cooling at the edges. Without being bound by theory, it is thought that the poor critical dimension uniformity seen using conventional etching processes comes from the wafer temperature non-uniformity. Increased plasma densities or concentrations near the wafer edges may give rise to higher temperatures proximate the wafer edges than proximate the wafer center. Normally, the higher the temperature, the higher the rate at which the plasma etches a material (e.g., photoresist and/or a dielectric layer). As such, the widths of openings formed in die close to the wafer edge are typically greater than the widths of openings at the wafer center.

The addition of $C_xH_yF_z$, optionally with a cyclic (hydro)fluorocarbon, to the etchant gas is believed to result in generation of a polymer that preferentially deposits at areas where the wafer temperature is higher. Because the wafer edge may have a higher temperature, more carbon-containing residue and/or polymer may be formed at the edge of the wafer than at the center. The additional residue or polymer at the wafer edge is thought to protect the photoresist from erosion to compensate for the greater photoresist etch rate that may exist under certain conditions at the wafer edge. This additional residue may also be useful in preventing excess lateral etching of vertical surfaces in the openings, as the openings are formed. In addition to polymer on the photoresist, polymer can form on sidewalls of the openings as it is formed. The addition of $CH_2F$—$CF_3$ or of $CH_2F$—$CF_3$ plus a cyclic (hydro)fluorocarbon to the etchant gas preferably results in increased uniformity in the lateral dimensions of openings formed using such a plasma etch chemistry.

The etch chemistry described herein may be used to etch the entire opening. Alternatively, the new etch chemistry may be used in a first step of a two-step etch methodology. The new etch chemistry may be used to etch substantially though the dielectric layer. Before etching through the dielectric layer is completed, a second etch chemistry substantially free of $CH_2F$—$CF_3$ and cyclic (hydro)fluorocarbons may be used for over-etching the dielectric layer. The second etch chemistry may be used to improve control of etch rate and to maintain the integrity of the interface between the dielectric layer and the underlying conductive materials.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
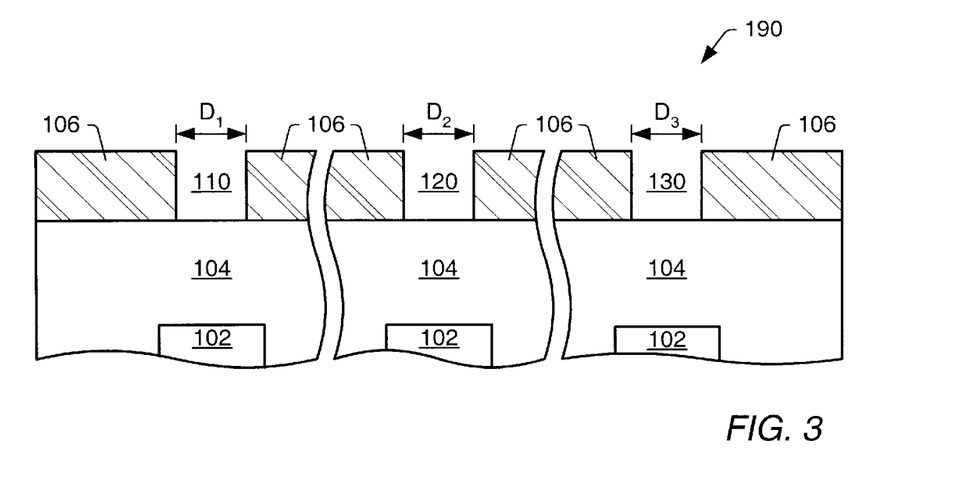
FIG. 3 depicts a semiconductor topography including a patterned photoresist layer.

Turning now to the drawings, FIG. 3 depicts a semiconductor topography 190 similar to topography 90 depicted in FIG. 1. As shown in FIG. 3, a dielectric layer 104 is formed over a portion of a conductive line 102. According to an embodiment, conductive line 102 may include a metal. According to an alternative embodiment, conductive line 102 may include doped polysilicon. Conductive line 102 may be spaced above a semiconductor substrate (not shown) by intervening layers of dielectric, semiconductive and/or conductive material. Alternatively, dielectric layer 104 may be formed directly upon portions of the semiconductor substrate.

Patterned photoresist 106 resides upon dielectric layer 104. Openings 110, 120, and 130 may be formed in photoresist layer 106 using well-known photolithography techniques. Openings 110, 120, and 130 are preferably formed with critical dimensions $D_1$, $D_2$, and $D_3$, respectively. Opening 120 is shown to be near the center 103 of the wafer, while openings 110 and 130 are shown near the edges 101 of the wafer. According to an embodiment, the critical dimensions may be substantially uniform. Alternatively, the critical dimensions $D_1$, $D_2$, and $D_3$ may vary from each other.

According to an embodiment, a mixture of two etchants ($CH_2F$—$CF_3$, or a combination of $CH_2F$—$CF_3$ and cyclic (hydro)fluorocarbon) may be introduced into the plasma chamber. The mixture may comprise a first etchant of the formula $C_xH_yF_z$. In a most preferred embodiment, x may be $\geq 2$ and more specifically $2 \leq x \leq 6$. Preferrably, $y \geq 1$, $1 \leq y \leq x$, or $1 \leq y \leq 2x$. Preferably, $z \geq 2$, $2 \leq z \leq 2x+1$, or $x \leq z \leq 2x+1$. The relationship of x, y and z may be y+z=2x or 2x+2. In a more preferred embodiment, the first etchant is $C_2H_2F_4$, most preferably the first etchant is $CH_2F$—$CF_3$. The etchant mixture is introduced into the etch chamber in a gas phase.

The flow rate of the first etchant may be substantially between about 0.1 and about 50 sccm, and preferably about 6 sccm. As a result of the first etchant in the plasma, carbon-containing residue may form on sidewalls of the patterned photoresist and the openings formed in the material layer. The residue so formed is believed to deposit to a greater thickness on sidewall surfaces of openings proximate the edges of the semiconductor wafer than on sidewall surfaces of openings proximate the center of the wafer. As such, the residue deposition advantageously counterbalances the increased etch rate which may be seen at the wafer edges.

According to an alternative embodiment, a cyclic (hydro) fluorocarbon may be further present in the etchant mixture. Preferably, the cyclic (hydro)fluorocarbon compound contains a strained ring. Preferably, the cyclic (hydro) fluorocarbon has a vapor pressure of at least 10 mTorr at 100° C. Preferably, the compound contains between 3 and 20 carbon atoms, and more preferably three or four carbon atoms. The ring may alternatively contain one or more heteroatoms (e.g., oxygen or nitrogen) in addition to the carbon atoms. The ring may contain unsaturated bonds; however, saturated rings are preferred. Preferred cyclic compounds have the general chemical formula $C_aF_bH_cR_d$, where a=3 or 4; b+c+d=2a; each R is individually $C_eF_fH_g$, where f+g=2e+1; $3 \leq a+e \leq 10$; b, c, d, e, f, and g are all $\geq 0$; and f+b>0. Non-limiting examples of suitable cyclic (hydro) fluorocarbons include strained cyclic (hydro)fluorocarbon such as $c-C_4F_8$, $c-C_3F_6$, and $c-C_3F_5(CF_3)$, where "c" denotes a cyclic structure. Preferably, the strained cyclic (hydro) fluorocarbon is $c-C_4F_8$. The flow rate of strained cyclic (hydro)fluorocarbon $c-C_4F_8$ may be substantially between about 0 and about 100 sccm, and preferably about 2 sccm, as shown in Table I, set forth hereinbelow.

Figure 4:
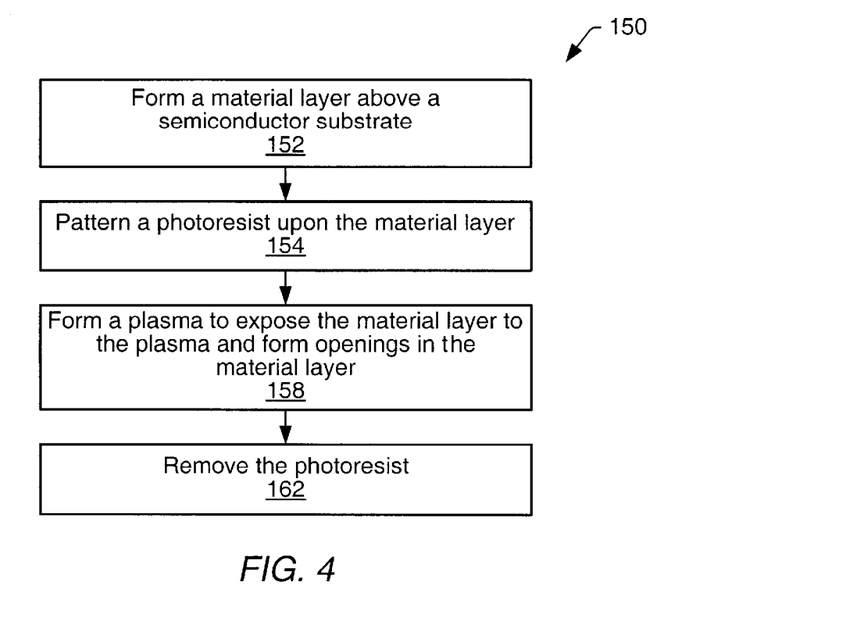
FIG. 4 depicts a flow diagram for a method of forming openings in a material layer of a semiconductor topography.

FIG. 4 depicts an embodiment of a methodology 150 for forming openings in a material above a semiconductor substrate. As shown in step 152, a material layer is formed above a semiconductor wafer. According to an embodiment, the material layer may include a dielectric material. Non-limiting examples of suitable dielectric materials include $SiO_2$-based materials such as undoped silicon dioxide and doped silicon dioxide (e.g., silicon dioxide doped with boron and/or phosphorous to form, e.g., borophosphosilicate glass, borosilicate glass, or phosphosilicate glass); a silicon dioxide/silicon nitride/silicon dioxide (ONO) structure; low-K dielectrics such as $SiO_2$ doped with, e.g., fluorine or chlorine; a spin-on glass; a silicon oxynitride; and tetraethyl orthosilicate (TEOS)-based films, either undoped or doped with boron and/or phosphorous (e.g., BPTEOS). The thickness of the material layer is not limited, yet is preferably substantially between about 0.1 µm and about 5.0 µm.

According to an embodiment, the material layer may be formed spaced above the semiconductor wafer upper surface by a layer or layers of conductive, semiconductive, and/or insulative materials. Alternatively, the material layer may be formed upon an upper surface of the semiconductor wafer. As shown in step 154, a layer of photoresist may then be patterned above the material layer using techniques well known to those of ordinary skill in the art. Openings may be formed in the photoresist that correspond to the locations of openings to be formed in the material layer.

A plasma may then be formed in a chamber in which the semiconductor wafer resides, as shown in step 158. Description of one exemplary methodology for initiating a plasma etch (and exemplary etch recipe) is set forth in U.S. Pat. No. 5,441,596 to Nulty (incorporated herein by reference). The chamber may be any commercially available dry-etch chamber containing, e.g., parallel plate electrodes, such chambers being available as CENTURA MxP series obtainable from Applied Materials (Santa Clara, Calif.).

The etch conditions in the plasma chamber may be as shown in Table I. For example, the chamber pressure may be substantially between about 10 and about 500 mTorr, more preferably between 30 and 200 mTorr; the RF power may be substantially between about 100 and about 1500 W, more preferably between 200 and 1000 W, and the applied magnetic field may be substantially between about 0 and about 50 G, more preferably between 5 and 20 G, and the backside helium pressure may be substantially between about 2 and about 50 Torr, more preferably between 5 and 30 Torr. The chamber temperature and/or ambient within the chamber surrounding the wafer may be substantially between −120° C. and 550° C., preferably between room temperature and 300° C., and more preferably between 30° C. to 100° C. during the plasma etch process. The wafer temperature is, on average, less than the chamber temperature. For example, the wafer temperature can be between 10° C. to approximately 50° C. less than the chamber temperature, the higher variation being prevalent when plasma temperatures are relatively high, e.g., 250° C. or greater.

The greatest effect of critical dimension control occurs when the etch temperatures are relatively high. The etch conditions are selected such that the openings in the material being etched have a lateral dimension that does not vary by more than a critical variation from its corresponding target/ predetermined lateral dimension. Conditions that may influence variations in the openings may include the flow rate ratios of the first etchant and/or conditions of the chamber during etch. According to an exemplary embodiment, the chamber pressure is preferably about 80 mTorr, the RF power is preferably about 500 W, the magnetic field is preferably about 10 G, and the backside helium pressure is preferably about 15 Torr.

The etchant mixture also comprises a second etchant, chemically distinct from the first etchant. The second etchant may act as the primary, or bulk, source of etching species in the plasma. The second etchant may include at least one halocarbon species. Preferably, the etching gas includes at least one compound of the formula $CH_mF_n$, preferably $CF_4$, $CHF_3$ and $CH_3F$. The etching gas is introduced at a total flow rate of preferably between about 5 and about 300 sccm, preferably between about 10 and about 200 sccm, and more preferably between about 40 and about 150 sccm ($CH_3F$), as shown in Table I. According to an embodiment, the other etchant comprises a mixture of $CF_4$ and $CHF_3$, where the $CF_4$ flow rate is preferably about 40 sccm and the $CHF_3$ flow rate is preferably about 30 sccm.

TABLE I

| | Main Etch | |
|---|---|---|
| | Preferred Range | Exemplary Target |
| Chamber Conditions | | |
| Chamber Pressure | 10–200 mTorr | 80 mTorr |
| Radio Frequency Power | 100–1500 W | 500 W |
| Magnetic Field | 0–50 G | 10 G |
| Helium Backside Pressure | 0–50 Torr | 15 Torr |
| Temperature | –120–550° C. | 30–100° C. |
| Etchant Gas | | |
| $CF_4$ | 5–200 sccm | 40 sccm |
| $CHF_3$ | 0–200 sccm | 30 sccm |
| $CH_3F$ | 0–200 sccm | 0 sccm |
| Additives | | |
| $CH_2F$—$CF_3$ | 0.1–50 sccm | 6 sccm |
| c-$C_4F_8$ | 0–100 sccm | 2 sccm |

The plasma is formed and the material is exposed to the plasma as shown in step 158 of FIG. 4. Exposure to the plasma preferably etches the material layer such that openings are formed in areas not masked by the overlying photoresist. The photoresist is subsequently stripped from upon the material layer, as shown in step 162, and processing of the wafer to form integrated circuits is continued.

Figure 5:
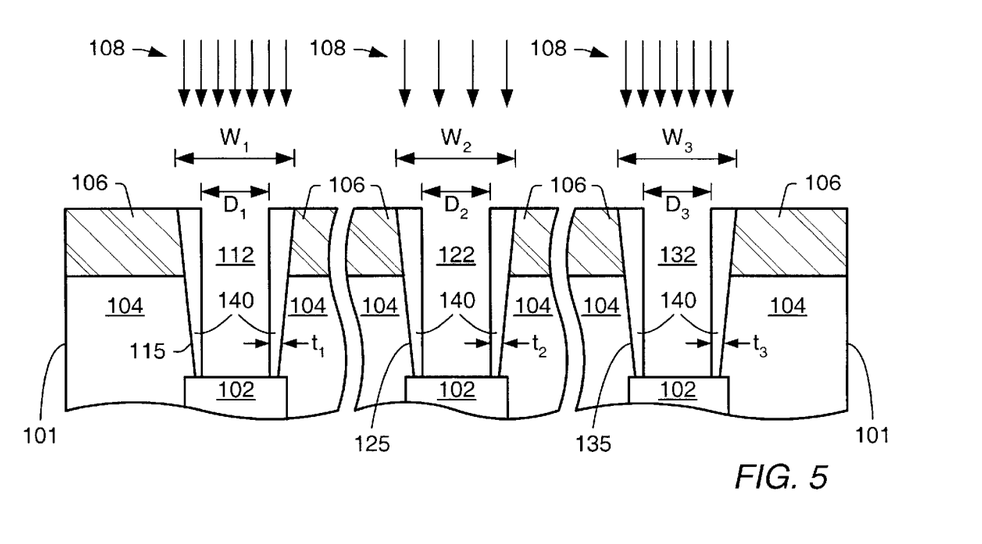
FIG. 5 depicts the semiconductor topography of FIG. 3 in which openings have been formed according to an embodiment of the present methodology.

Turning now to FIG. 5, openings 112, 122, and 132 have been formed in dielectric layer 104 by exposure of the dielectric layer to plasma etch 108. The density or concentration of the arrows in FIG. 5 (which represent reactive species in plasma 108) show that the etch rate of plasma 108 may be greater proximate the edges 101 of the wafer than proximate the center 103. This may be due to the disparate residue or plasma concentration nearer the periphery of the chamber and the wafer placed therein. The addition of $CH_2F$—$CF_3$, or of $CH_2F$—$CF_3$ with a cyclic (hydro) fluorocarbon, to plasma 108 may result in generation of a carbon-containing residue 140 that preferentially deposits at the wafer edges 101. In some circumstances, depending on the configuration of the chamber, the temperature may be greater near the edge of the chamber walls and therefore at the edge of the wafer than at the center. The wafer edge may therefore have a higher temperature nearer the wafer edge than the center, and the plasma may also be higher at the wafer edge than at wafer center 103. More residue or polymer may therefore be deposited at the edge of the wafer than at the center. Consequently, more polymer is available to deposit on the wafer and/or photoresist surfaces at the edge of the wafer.

As illustrated in FIG. 5 polymer 140 has thicknesses $t_1$, $t_2$, and $t_3$, respectively, upon sidewall surfaces 115, 125, and 135 of openings 112, 122, and 132, respectively, where $t_1 > t_2$ and $t_3 > t_2$. The additional residue at the wafer edge is thought to protect the photoresist from erosion and to compensate for the greater photoresist etch rate at the wafer edge. The present etchant mixture preferably results in increased dimensional uniformity of the lateral dimensions of the openings. That is, variation in lateral dimensions $w_1$, $w_2$, and $w_3$ of openings 112, 122, and 132 is advantageously reduced to within acceptable levels relative to the corresponding critical dimensions $D_1$, $D_2$, and $D_3$. It is to be noted that features in FIGS. 3 and 5 are not drawn to scale, but are exaggerated in order to highlight, for example, lateral dimensions $w_1$, $w_2$, and $w_3$ of openings 112, 122, and 132. It is of benefit that the openings do not vary beyond a critical value. According to one exemplary result, the critical variation in the opening diameter or width (even at relatively small resolvable sizes) preferably varies less than 50%, and preferably does not vary more than 3% from one opening to another opening across the entire wafer topography. However, the critical variation value is one that is achieved at two standard deviations (e.g., 95% of the time) from a statistical viewpoint, preferably one standard deviation (e.g., 97% of the time).

Figure 6:
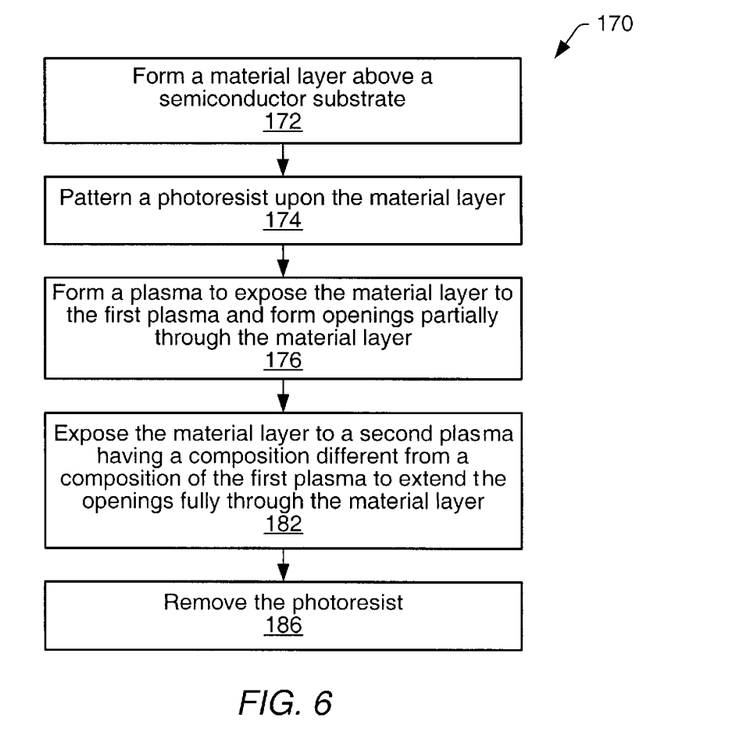
FIG. 6 depicts a flow diagram for an alternative method of forming openings in a material layer of a semiconductor topography.

The process chemistry described herein may be used to etch the entire opening, as shown in FIG. 4. Alternatively, the etch chemistry may be used in a first step of a two-step etch methodology 170, depicted in FIG. 6. Steps of FIG. 6 are largely the same as for FIG. 4 with the exception that a material layer may be formed above a semiconductor wafer. The material layer may be spaced above the wafer upper surface by a layer or layers of conductive, semiconductive, or insulative materials. Alternatively, the material layer may reside upon the upper surface of the wafer. Preferably, the material layer is a layer of a dielectric material, such as one of the dielectric materials described with respect to FIG. 4.

As shown in step 174, a layer of photoresist may then be patterned above the material layer using techniques well known to those of ordinary skill in the art. Openings may be formed in the photoresist that correspond to the locations of openings to be formed in the material layer. A first plasma may then be formed in a chamber in which the semiconductor wafer resides, as shown in step 176. The plasma chamber may be conditioned as shown in Table I. An etchant mixture may be introduced into the chamber to form the plasma. The etchant mixture and etch conditions may include that which is described above, and referenced in Table I.

The first plasma may be used to etch partially though the material layer, as shown in step 176. Before completing the etch through the dielectric layer, exposure to the first plasma may be terminated. A second etch chemistry substantially free of the first etchant and/or strained cyclic (hydro) fluorocarbon may then form a second plasma and over-etch the material layer, extending the openings fully through the material layer, as shown in step 182 and depicted in Table II. The second etch chemistry may improve control of the etch rate and maintain the integrity of the interface between the material layer to be etched and the underlying layer or layers. The photoresist is subsequently stripped from upon the material layer, as shown in step 186, and processing of the wafer to form integrated circuits is continued.

TABLE II

| | Over-Etch | |
|---|---|---|
| | Preferred Range | exemplary Target |
| Chamber Conditions | | |
| Chamber Pressure | 10–200 mTorr | 80 mTorr |
| Radio Frequency Power | 100–1500 W | 500 W |
| Magnetic Field | 0–50 G | 10 G |
| Helium Backside Pressure | 0–50 Torr | 15 Torr |
| Temperature | 0–550° C. | 30–100° C. |
| Etchant Gas | | |
| $CF_4$ | 5–200 sccm | 40 sccm |
| $CHF_3$ | 0–200 sccm | 30 sccm |
| $CH_3F$ | 0–200 sccm | 0 sccm |

It will be appreciated to those skilled in the art having the benefit of this disclosure that this invention is believed to provide a plasma composition and method for increasing dimensional uniformity when forming openings, for example, in dielectric layers. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method of forming openings within a material across a semiconductor topography on a wafer, comprising:

exposing portions of an upper surface of said material through photoresist openings of a photoresist layer arranged upon said material;

etching the exposed portions with an etchant mixture comprising a first etchant of the formula $C_xH_yF_z$ (where $x \geq 2$, $y \geq 1$ and $z \geq 2$) and a second etchant other than the first etchant to form said openings within the material under conditions providing at least 95% of said openings has a lateral dimension that varies across the wafer by less than a critical variation; and forming a carbon containing residue to a greater extent upon sidewall surfaces of photoresist openings proximate edges of the wafer than upon sidewall surfaces of photoresist openings proximate a center of the wafer.

2. The method as recited in claim 1, wherein x is 2, y is from 1 to 4, z is from 2 to 5, and y+z is 4 to 6.

3. The method as recited in claim 1, wherein the second etchant comprises a compound of the formula $CH_mF_n$, where n+m is a number from 0 to 4.

4. The method as recited in claim 1, wherein each of said openings within the material has a critical dimension, and wherein differences in said critical dimension for at least 95% of the openings are less than the critical variation.

5. The method as recited in claim 1, wherein said carbon-containing residue compensates for erosion of said photoresist layer during said etching.

6. The method as recited in claim 1, wherein said etchant mixture further comprises a cyclic (hydro)fluorocarbon.

7. The method as recited in claim 6, wherein said cyclic (hydro)fluorocarbon is cyclic $C_4F_8$, cyclic $C_3F_6$, or cyclic $C_3F_5(CF_3)$.

8. The method as recited in claim 1, wherein said first etchant comprises 1,1,1,2 tetrafluoroethane.

9. The method as recited in claim 1, wherein said critical variation is approximately 3%.

10. A method of forming openings in a material on a semiconductor topography of a wafer, comprising:

patterning a photoresist layer arranged upon said material to form photoresist openings therethrough;

introducing an etchant mixture comprising a first etchant of the formula $C_xH_yF_z$ (where $x \geq 2$, $y \geq 1$ and $z \geq 2$) and a second etchant other than the first etchant into a chamber comprising the wafer;

producing a first plasma within said chamber to form openings under the photoreist openings and extending into the material, said openings having a depth less than a thickness of said material; and forming a carbon containing residue to a greater extent upon sidewall surfaces of photoresist openings proximate edges of the wafer than upon sidewall surfaces of photoresist openings proximate a center of the wafer.

11. The method as recited in claim 10, further comprising producing a second plasma subsequent to producing said first plasma, said second plasma being substantially free of said first etchant to extend the depth of said openings through the thickness of said material.

12. The method as recited in claim 10, wherein the second etchant comprises at least one of compound of the formula $CH_mF_n$, where n+m is a number from 0 to 4.

13. The method as recited in claim 10, wherein said etchant mixture further comprises a cyclic (hydro) fluorocarbon.

14. The method as recited in claim 13, wherein said cyclic (hydro)fluorocarbon is cyclic $C_4F_8$, cyclic $C_3F_6$, or cyclic $C_3F_5(CF_3)$.

15. The method as recited in claim 10, wherein each of said openings in said material deviates from a critical dimension by less than a critical variation.

16. The method as recited in claim 10, wherein said forming the carbon-containing residue comprises compensating for erosion of said photoresist layer while forming the openings in said material.

17. The method as recited in claim 10, wherein said first etchant comprises 1,1,1,2 tetrafluoroethane.

18. The method as recited in claim 10, wherein said producing said first plasma comprises forming 95% of said openings in the material with a lateral dimension that varies across the wafer by less than 3%.

19. A method of forming openings within a material across a semiconductor topography on a wafer, comprising:

exposing portions of an upper surface of said material; and etching the exposed portions with an etchant mixture comprising:

a first etchant of the formula $C_xH_yF_z$ (where $x \geq 2$, $y \geq 1$ and $z \geq 2$);

a cyclic (hydro)fluorocarbon; and a second etchant other than the first etchant and the cyclic (hydro)fluorocarbon, wherein said etchant mixture is adapted to form said openings within the material such that at least 95% of said openings have a lateral dimension that varies across the wafer by less than a critical variation.

20. The method as recited in claim 19, wherein said cyclic (hydro)fluorocarbon is cyclic $C_4F_8$, cyclic $C_3F_6$, or cyclic $C_3F_5(CF_3)$.

21. The method as recited in claim 19, wherein the second etchant comprises a compound of the formula $CH_mF_n$, where n+m is a number from 0 to 4.

22. The method as recited in claim 19, wherein said exposing comprises patterning a photoresist layer arranged upon said material to form photoresist openings therethrough.

23. The method as recited in claim 22, further comprising forming a carbon-containing residue to a greater extent upon sidewall surfaces of said photoresist openings proximate edges of the wafer than upon sidewall surfaces of photoresist openings proximate a center of the wafer.

24. A method of forming openings in a material on a semiconductor topography of a wafer, comprising producing a first plasma within a chamber comprising the wafer to form openings extending into the material, wherein said openings have a depth less than a thickness of said material; and wherein said producing comprises introducing an etchant mixture into the chamber, wherein said etchant mixture comprises a first etchant of the formula $C_xH_yF_z$ (where $x \geq 2$, $y \geq 1$ and $z \geq 2$) and a cyclic (hydro)fluorocarbon.

25. The method as recited in claim 24, wherein said cyclic (hydro)fluorocarbon is cyclic $C_4F_8$, cyclic $C_3F_6$, or cyclic $C_3F_5(CF_3)$.

26. The method as recited in claim 24, further comprising producing a second plasma to extend the depth of said openings through the thickness of said material subsequent to producing said first plasma, wherein said producing the second plasma comprises introducing an second etchant that is substantially free of said first etchant and said cyclic (hydro)fluorocarbon.

27. The method as recited in claim 26, wherein the second etchant comprises at least one of compound of the formula $CH_mF_n$, where n+m is a number from 0 to 4.

28. The method as recited in claim 24, further comprising patterning a photoresist layer arranged upon said material to form photoresist openings therethrough subsequent to said producing the first plasma.

29. The method as recited in claim 28, further comprising forming a carbon-containing residue on sidewall surfaces of said openings, wherein said residue resides to a greater extent upon the sidewall surfaces of openings proximate edges of the wafer than upon sidewall surfaces of openings proximate a center of the wafer.

* * * * *